United States Patent [19]
Peng

[11] Patent Number: 6,004,851
[45] Date of Patent: Dec. 21, 1999

[54] METHOD FOR MANUFACTURING MOS DEVICE WITH ADJUSTABLE SOURCE/ DRAIN EXTENSIONS

[75] Inventor: Chun-Hung Peng, Hsinchu, Taiwan

[73] Assignee: Holtek Microelectronics Inc., Hsinchu, Taiwan

[21] Appl. No.: 09/042,213

[22] Filed: Mar. 13, 1998

[30] Foreign Application Priority Data

Jul. 22, 1997 [TW] Taiwan ................................. 86110436

[51] Int. Cl.$^6$ .................................................. H01L 21/336
[52] U.S. Cl. ............................................ 438/301; 438/305
[58] Field of Search ..................................... 438/301, 303, 438/305

[56] References Cited

U.S. PATENT DOCUMENTS

| | | | |
|---|---|---|---|
| 5,541,132 | 7/1996 | Davies et al. | 437/45 |
| 5,683,921 | 11/1997 | Nishio et al. | 437/35 |
| 5,759,901 | 6/1998 | Loh et al. | 438/305 |
| 5,783,475 | 7/1998 | Ramaswami | 438/303 |
| 5,795,808 | 8/1998 | Park | 438/301 |
| 5,827,747 | 10/1998 | Wang et al. | 438/199 |
| 5,830,788 | 11/1998 | Hiroki et al. | 438/199 |

*Primary Examiner*—John F. Niebling
*Assistant Examiner*—Michael S. Lebentritt
*Attorney, Agent, or Firm*—Christensen O'Connor; Johnson & Kindess PLLC

[57] ABSTRACT

A method for manufacturing a metal-oxide-semico nductor field effect transistor (MOSFET) having a drain and a source each of which has a lightly doped area, an enhanced lightly doped area and a heavily doped area is disclosed. The method includes steps of lightly doping the silicon substrate having a gate structure to form the lightly doped areas of the source and the drain; forming a first non-conductive layer covering the silicon substrate and the gate, forming a second non-conductive layer covering the first non-conductive layer, forming a duple-sidewall including a side-wall-spacer of the first non-conductive layer and an inner spacer, heavily doping the silicon substrate to form the heavily doped areas of the source and the drain respectively, removing the side-wall-spacer of the first non-conductive layer, executing an anisotropic etching on the inner spacer to form a cascade-shaped spacer of the gate, and doping the silicon substrate to form the enhanced lightly doped area and thus forming the extension area of the heavily doped area.

19 Claims, 6 Drawing Sheets

METHOD FOR MANUFACTURING MOS DEVICE WITH ADJUSTABLE SOURCE/DRAIN EXTENSIONS

FIELD OF THE INVENTION

The present invention relates to a method for manufacturing a metal-oxide-semiconductor (MOS) device, and more particularly relates to a method for manufacturing a metal-oxide-semiconductor field effect transistor (MOSFET) having adjustable source/drain extensions.

BACKGROUND OF THE INVENTION

When the technology for manufacturing the MOS devices is gradually progressing into the deep sub-micron era, some problems which are not essential in the sub-micron process now become very important. For example, the conventional source/drain extension process meets a problem in the coincidence of lightly doped drain (LDD) and source/drain extension junctions underneath gate edge of a MOSFET. The coincidence of these junctions induces large reverse junction current that forces device become leakage. Furthermore, a high impact ionization rate will worsen the hot carrier effect. A discussion about the related problems can be found in Lisa T. Su (1996).

Figure 1A:
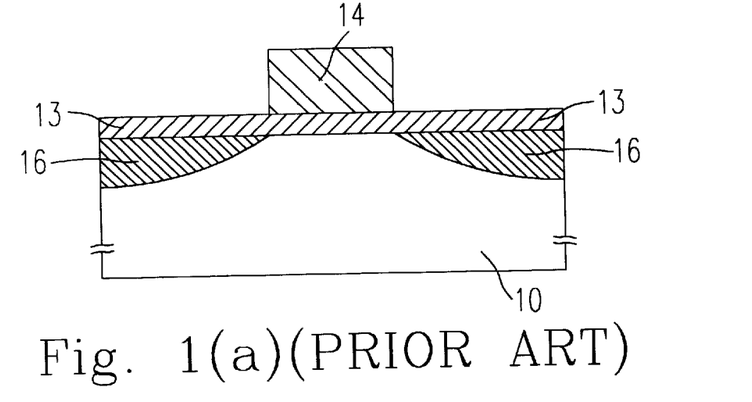
FIGS. 1(a) through 1(e) are diagrams illustrating a conventional method for manufacturing a MOS deivce.
Figure 1B:
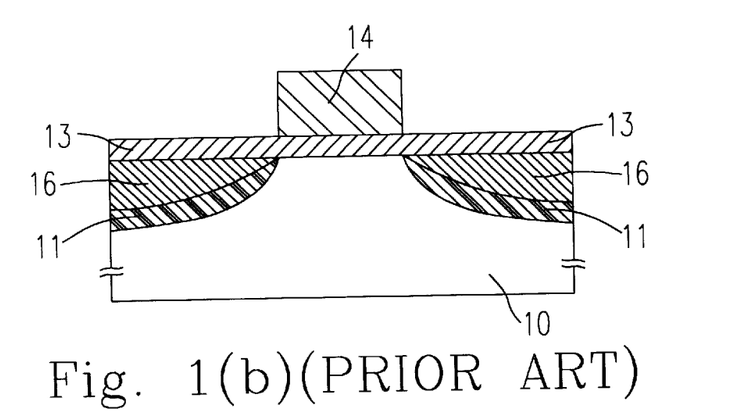
Figure 1C:
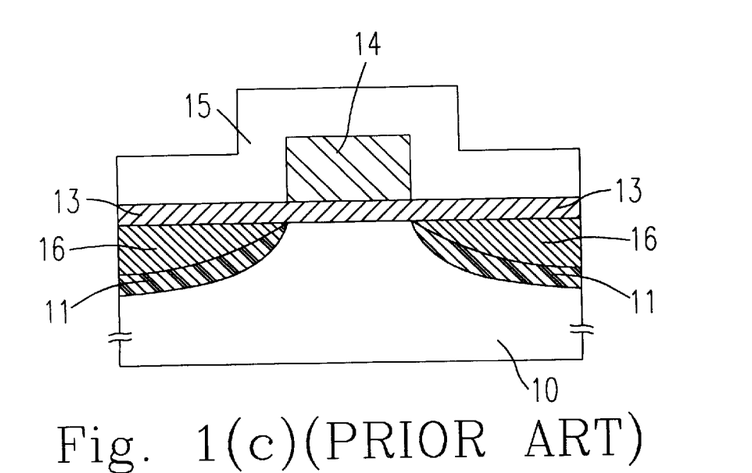
Figure 1D:
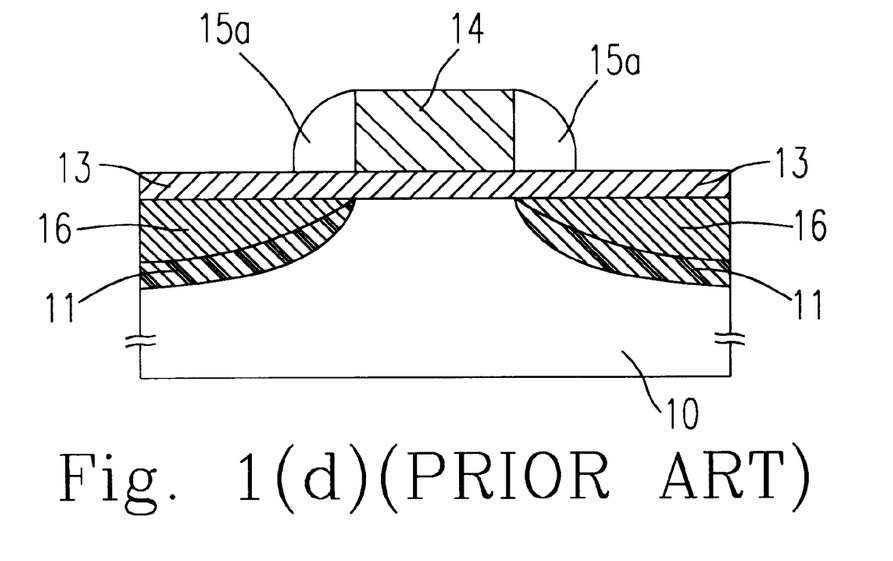
Figure 1E:
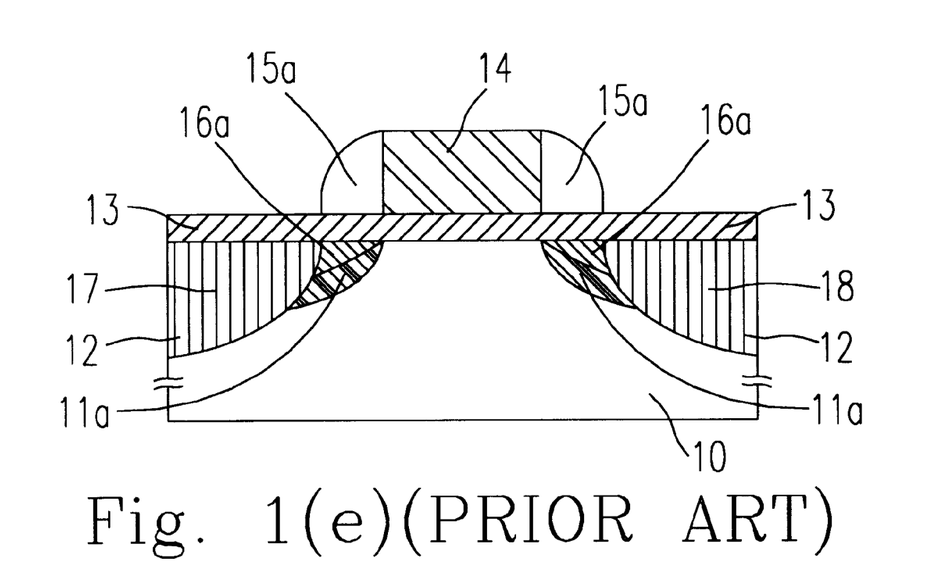

A conventional method for manufacturing a MOSFET is illustrated in FIGS. 1(a) to 1(e). Referring to FIG. 1(a), when the MOS structure including the gate oxide 13 and the gate 14 on a substrate 10 has been made, an ion implantation is executed to form the lightly doped areas 16 of the source and drain. This step is so called a "lightly doped drain" (LDD) process. To decrease the resistance of the lightly doped areas 16, another ion implantation is executed to form enhanced lightly doped areas 11 having a penetration depth shallower than that of the lightly doped areas 16 of the source and drain. Then a dielectric layer 15 is deposited over the gate 14 and the gate oxide 13. The dielectric layer 15 is etched to form the spacer 15a. After then, a heavily doped process is executed to form the heavily doped areas 12 to form the major portion of the source 17 and drain 18 of the MOS transistor 1. However, since the ion implantations of the lightly doped areas 16 and the enhanced lightly doped areas 11 use the same mask, i.e., the gate 14, most part of the junctions of the lightly doped areas 16 and the gate oxide 13 will overlap with the junctions between the enhanced lightly doped areas 11 and the gate oxide 13. The extensions of the source/drain are formed by portions 16a of the enhanced lightly doped areas 16 which are extended from the heavily doped areas 12. In the conventional process, the formation of the extensions 16a of the source/drain cannot be properly controlled, so the extension junctions of the source/drain are located too close to the channel of the transistor, which will decrease the performance of the MOSFET with LDD structure. The defects of the conventional process can be summarized as follows:

1. The coincidence of the junctions of the lightly doped source/drain and the extensions of the source/drain will cause a large reverse junction current and thus induce a current leakage of the transistor.
2. Such a structure will increase the probability of ion collisions so that the hot carrier effect will be aggravated.

To solve the above-mentioned problems, the present invention provides a method for manufacturing a MOSFET with adjustable source/drain extensions.

SUMMARY OF THE INVENTION

An object of the present invention is to provide a method for manufacturing a MOSFET wherein the length between LDD junction and source/drain one is adjustable.

According to the present invention, a method for manufacturing a metal-oxide-semi conductor field transistor (MOSFET) is provided. The MOSFET has a drain and a source each of which has a lightly doped area, an enhanced lightly doped area and a heavily doped area, wherein the heavily doped area has an extension area formed by a portion of the corresponding enhanced lightly doped area extending from the heavily doped area. The method includes steps of: preparing a silicon substrate; forming a gate oxide layer over the silicon substrate, and forming a gate over the gate oxide layer; lightly doping the silicon substrate to form the lightly doped areas of the source and the drain; forming a first nonconductive layer covering the silicon substrate and the gate; forming a second non-conductive layer covering the first non-conductive layer; executing an ananisotropic etching on the second non-conductive layer to form a side-wall-spacer of the first non-conductive layer; executing an ananisotropic etching on the first non-conductive layer to form an inner spacer formed by a portion of the first non-conductive layer; heavily doping the silicon substrate to form the heavily doped areas of the source and the drain respectively; removing the side-wall-spacer of the first non-conductive layer; executing an ananisotropic etching on the inner spacer to form a spacer of the gate; and doping the silicon substrate to form the enhanced lightly doped area and thus forming the extension area of the heavily doped area.

The gate is preferably made of polysilicon. The lightly doped areas, the enhanced lightly doped areas and the heavily doped areas of the drain and the source are preferably formed by ion implantations respectively.

The ion implantation for the lightly doped areas preferably has a dosage ranged from about $10^{12}$ to $5 \times 10^{13}$ atoms per square centimeter.

The ion implantation for the heavily doped areas preferably has a dosage ranged from about $5 \times 10^{14}$ to $5 \times 10^{15}$ atoms per square centimeter.

The ion implantation for the enhanced lightly doped areas preferably has a dosage ranged from about $1 \times 10^{13}$ to $5 \times 10^{15}$ atoms per square centimeter.

The first non-conductive layer is preferably a silicon nitride layer. The silicon nitride layer preferably has a thickness of about 10 to 300 nanometers.

The second non-conductive layer is preferably a silicon dioxide layer. The silicon dioxide layer preferably has a thickness of about 10 to 100 nanometers.

In accordance with another aspect of the present invention, the method for manufacturing a metal-oxide-semiconductor field effect transistor (MOSFET) having a drain and a source each of which has a lightly doped area and a heavily doped area is disclosed. Each of the heavily doped areas of the drain and the source has an extension area extending from the each heavily doped area. The method includes steps of: preparing a silicon substrate; forming a gate oxide layer over the silicon substrate, and forming a gate over the gate oxide layer; lightly doping the silicon substrate to form the lightly doped areas of the source and the drain; forming a first non-conductive layer covering the silicon substrate and the gate; forming a second non-conductive layer covering the first non-conductive layer; executing an ananisotropic etching on the second non-conductive layer to form a side-wall-spacer of the first nonconductive layer; executing an ananisotropic etching on the first nonconductive layer to form an inner spacer formed by a portion of the first non-conductive layer having a stepped shape, wherein a stepped portion of the inner spacer is located under the side-wall-spacer of the first nonconductive layer; removing the side-wall-spacer of the first non-conductive layer and keeping the inner spacer on the silicon substrate; and heavily doping the silicon substrate to form the heavily doped areas and the extension areas of the source and the drain respectively, wherein the extension areas are located under the stepped portion of the inner spacer.

The gate is preferably made of polysilicon. The lightly doped area and the heavily doped area are preferably formed by ion implantations respectively. The ion implantation for the lightly doped area preferably has a dosage ranged from about $10^{12}$ to $5\times10^{13}$ atoms per square centimeter. The ion implantation for the heavily doped area preferably has a dosage ranged from about $5\times10^{13}$ to $5\times10^{15}$ atoms per square centimeter.

The first non-conductive layer is preferably a silicon nitride layer, and the silicon nitride layer has a thickness of about 10 to 300 nanometers.

The second non-conductive layer is preferably a silicon dioxide layer. The silicon dioxide layer preferably has a thickness of about 10 to 100 nanometers.

The present invention may best be understood through the following description with reference to the accompanying drawings, in which:

DETAILED DESCRIPTION OF THE PREFERRED EMBODIMENTS

Figure 2A:
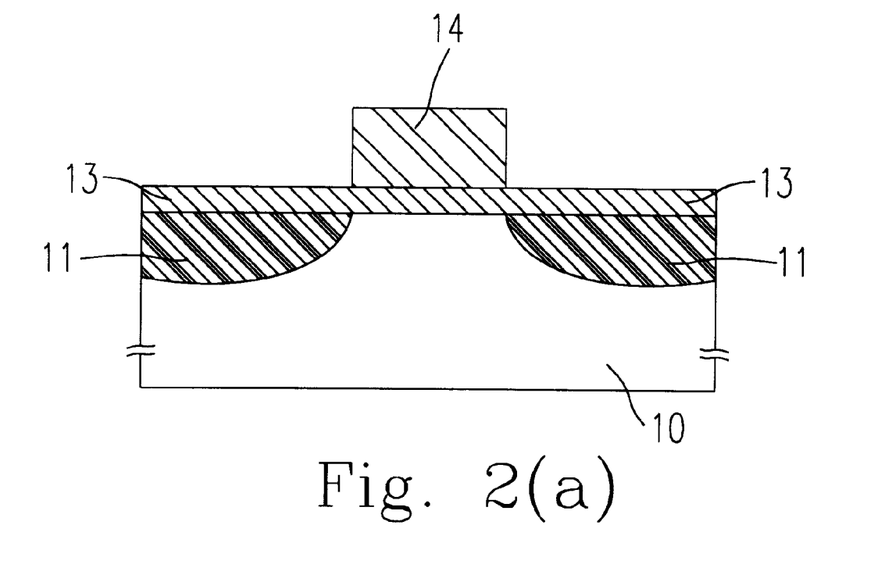
FIGS. 2(a) through 2(h) illustrate processes of a preferred embodiment of a method for manufacturing a MOS device according to the present invention.

FIGS. 2(a) to 2(h) illustrate a preferred embodiment of a method for manufacturing a MOSFET according to the present invention. Referring to FIG. 2(a), a gate oxide layer 13 and a polysilicon gate 14 are formed on a semiconductor substrate 10. Then an ion implantation is executed to form the lightly doped areas 11. These areas will form the LDD structures when the source/drain of the MOSFET device are made.

Figure 2B:
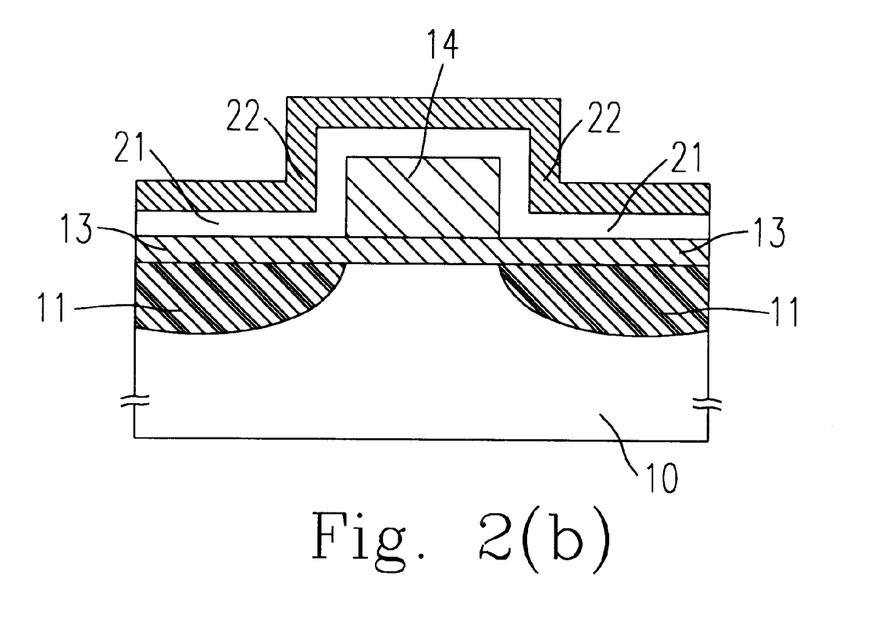

FIG. 2(b) illustrates a critical step of the present invention. A first non-conductive layer 21 is deposited over the gate 14 and the gate oxide layer 13. After the first non-conductive layer 21 is formed, the second non-conductive layer 22 is subsequently deposited on the first nonconductive layer 21. The materials for forming the first and second nonconductive layer are different and can be properly chosen by those skilled in the etching technology. A factor for choosing the materials is that the first non-conductive layer 21 and the second non-conductive layer 22 are capable of serving as etching stoppers of each other. Preferably, the first non-conductive layer is a silicon nitride ($Si_3N_4$) layer formed by a chemical vapor deposition (CVD), and the second non-conductive layer 22 is a silicon dioxide ($SiO_2$) layer formed by a CVD with tetraethylorthosilane (TEOS). The thickness of the first non-conductive layer 21 can be adjusted to control the length between lightly doped and enhanced lightly doped areas. The thickness of the first non-conductive layer 21 can be about 10 nm to 300 nm, while that of the second nonconductive layer 22 can be about 10 nm to 100 nm.

Figure 2C:
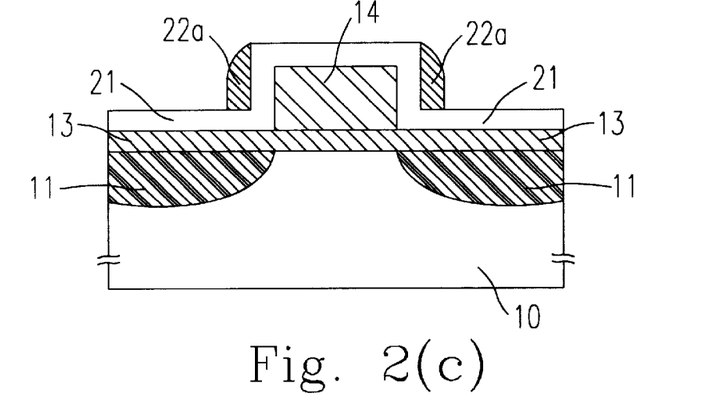

The second non-conductive layer 22 is etched by an ananisotropic etching process. During the etching process, the first non-conductive layer 21 serves as an etching stopper. After the etching process, the side-wall-spacers 22a for the first non-conductive layer 21 will be formed and will cover the lateral walls of the gate 14, as shown in FIG. 2(c).

Figure 2D:
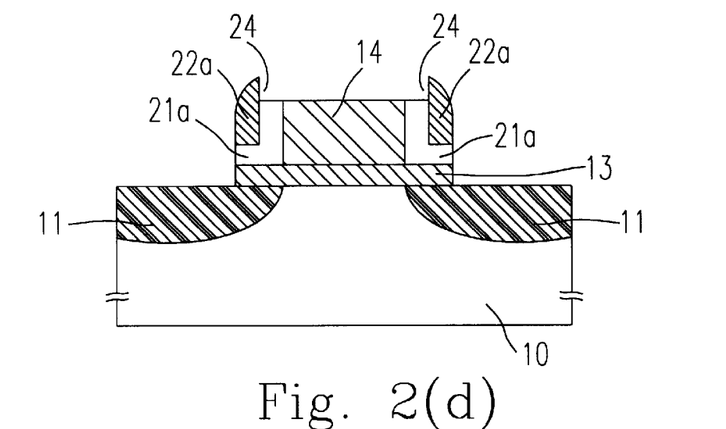

Referring to FIG. 2(d), another anisotropic etching is executed on the first non-conductive layer 21. The sidewalls 22a and the gate 14 serve as the mask and the etch stopper. After the etching is finished, the inner side walls 21 a are formed between the gate 14 and the sidewalls 22a. Thus, the sidewalls 22a formed by a portion of the second non-conductive layer 22 and the inner sidewalls 21a formed by a portion of the first nonconductive layer 21 construct duple sidewalls 24. The thickness of the duple sidewalls 24 can be controlled by adjusting the deposited thickness of the first non-conductive layer 21.

Figure 2E:
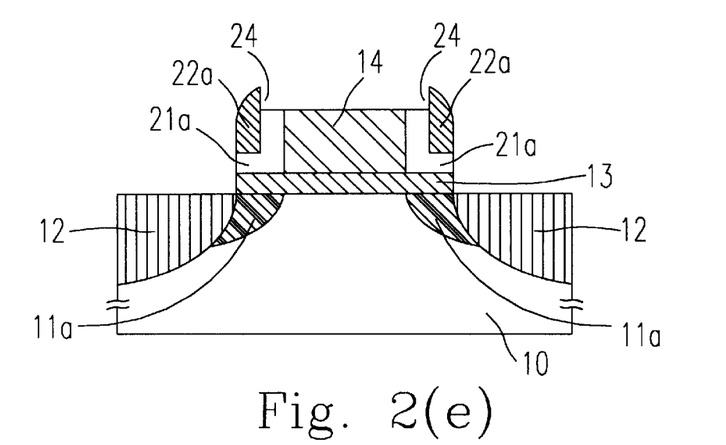

Then, the ion implantation for forming the heavily doped areas 12 is executed. The doping concentration is ranged between $5\times10^{13}$ and $5\times10^{15}$ atoms/cm$^2$. The mask includes the gate 14 and the duple sidewalls 24. So when the heavily doped areas 12 are formed, a portion 11a of the lightly doped areas 11 will extend from the heavily doped areas 12, as shown in FIG. 2(e).

Figure 2F:
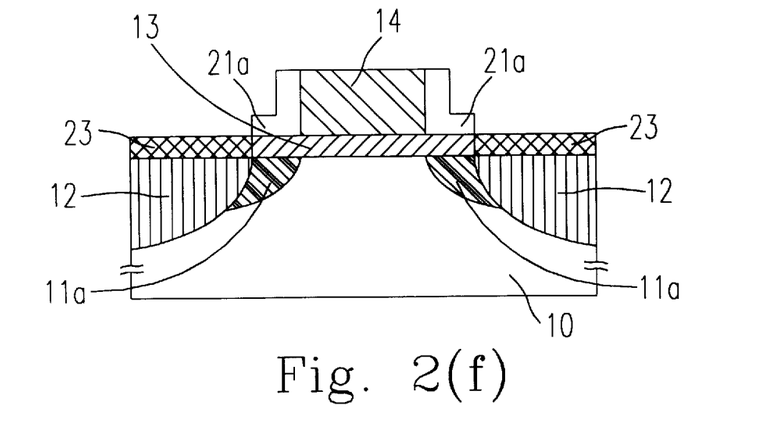

As illustrated in FIG. 2(f), the sidewalls 22a are removed by either dry etching or wet dip. Before the formation of extensions of the source/drain, it is better to form a re-oxidized layer 23 to protect the silicon substrate 10. In a further process for manufacturing the device, a silicon nitride layer may be deposited on the silicon substrate 10. The re-oxidized layer 23 may protect the substrate 10 from being damaged by the stress occurred at the silicon nitride/silicon junction. Layer 23 should be executed before heavily implant as a screening oxide to prevent from implant channeling. To form the re-oxidized layer 23, the exposed portion of the gate oxide layer 13 must be removed, then the re-oxidized layer 23 is grown by thermal oxidization.

Figure 2G:
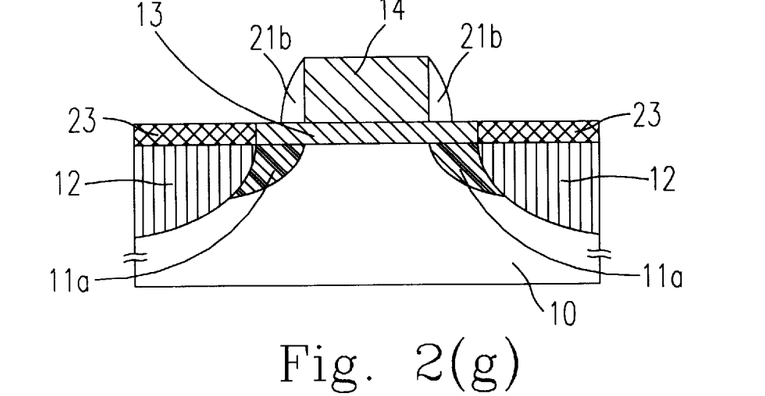
Figure 2H:
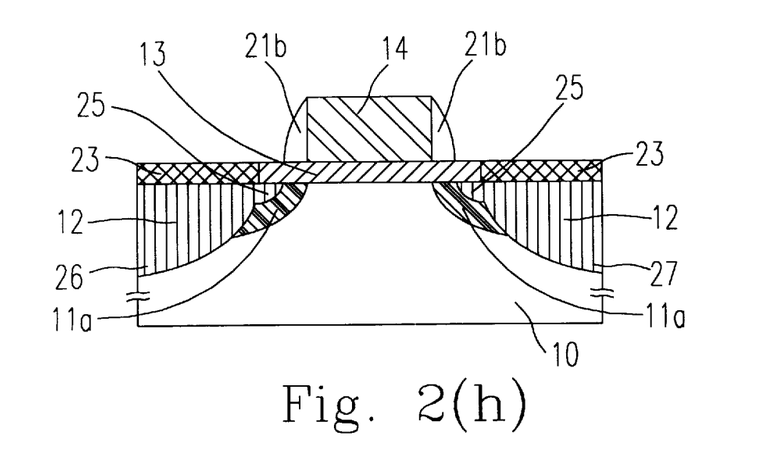

Referring to FIG. 2(g), an anisotropic etching is executed on the step-shaped sidewalls 21a to form the cascade-shaped spacers 21b of the gate 14. During this step, the gate oxide layer 13 and the re-oxidized layer 23 serve as the etching stoppers. Finally, an ion implantation with dosage ranged from $1\times10^{13}$ to $5\times10^{15}$ atoms/cm$^2$ is executed while gate 14 and the cascade-shaped spacers 21b are serving as the mask. The result is shown in FIG. 2(h), the enhanced lightly doped areas 25 are extended from the heavily doped areas 12 and thus form the extensions of the source 26 and drain 27 of the MOSFET.

Figure 3A:
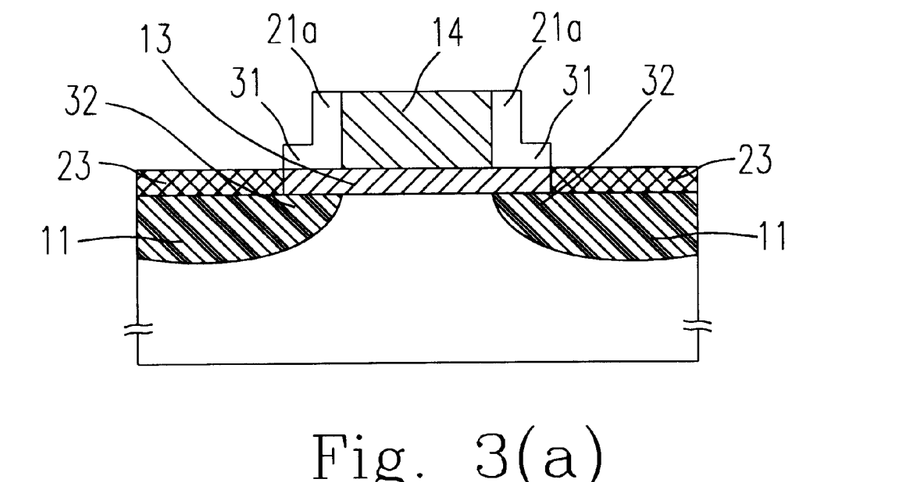
FIGS. 3(a) to 3(b) illustrate processes of another preferred embodiment of a method for manufacturing a MOS device according to the present invention.
Figure 3B:
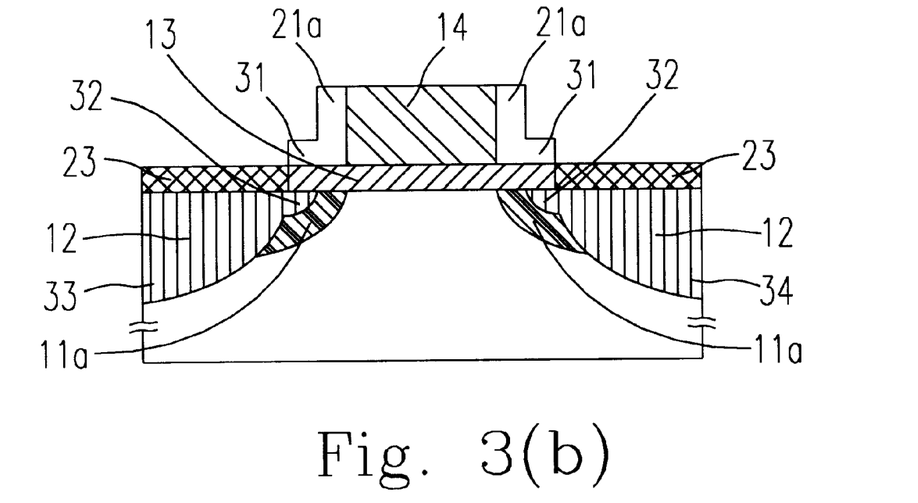

Another preferred embodiment of the method of the present invention can be obtained by modifying the above-mentioned process. In this embodiment, the procedures from preparing a substrate 10 to forming the duple sidewalls 24 are the same as those illustrated from FIG. 2(a) through FIG. 2(d). The successive process can be illustrated as FIG. 3(a), wherein the sidewalls 22a outside of the inner sidewalls 21a are removed before the heavily doping process of the source/drain. There also may include a step for forming the re-oxidization layer 23 having a thickness of about 10 to 100 nm on the silicon substrate 10 to protect it. Because the sidewalls 22a outside of the inner sidewalls are removed, the step structures 31 of the step-shaped sidewalls 21a are exposed. So when the ion implantation of the heavily doped area 12 is executed, there will form extension areas 32 of the heavily doped areas 12 under step structures 31. The doping concentration of this step is about $1\times10^{14}$ to $5\times10^{15}$ atoms/cm$^2$.

Since the spacer width formed by anisotropically etching of the first non-conductive layer can be adjusted through as-deposited layer thickness control and etching recipe turning, the distance between LDD and source/drain extension junctions can be adjustable. Reverse junction leakage current is therefore reduced and hot carrier effect is suppressed through appropriate spacer width adjusting.

While the invention has been described in terms of what are presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for manufacturing a metal-oxide-semiconductor (MOS) device having a drain and a source each of which has a lightly doped area, an enhanced lightly doped area and a heavily doped area, wherein said heavily doped area has an extension area formed by a portion of said corresponding enhanced lightly doped area extending from said heavily doped area, said method comprising steps of:
    (a) preparing a silicon substrate;
    (b) forming a gate oxide layer over said silicon substrate, and forming a gate over said gate oxide layer;
    (c) lightly doping said silicon substrate to form said lightly doped areas of said source and said drain;
    (d) forming a first non-conductive layer covering said silicon substrate and said gate;
    (e) forming a second non-conductive layer covering said first nonconductive layer;
    (f) executing an ananisotropic etching on said second non-conductive layer to form a side-wall-spacer of said first non-conductive layer;
    (g) executing an ananisotropic etching on said first non-conductive layer to form an inner spacer formed by a portion of said first non-conductive layer;
    (g) heavily doping said silicon substrate to form said heavily doped areas of said source and said drain respectively;
    (h) removing said side-wall-spacer of said first non-conductive layer;
    (i) executing an ananisotropic etching on said inner spacer to form a cascade-shaped spacer of said gate; and
    (k) doping said silicon substrate to form said enhanced lightly doped area and thus forming said extension area of said heavily doped area.

2. A method according to claim 1 wherein said gate is made of polysilicon.

3. A method according to claim 1 wherein said lightly doped areas, said enhanced lightly doped areas and said heavily doped areas of said drain and said source are formed by ion implantations respectively.

4. A method according to claim 3 wherein said ion implantation for said lightly doped areas has a dosage ranged from about $10^{12}$ to $5 \times 10^{13}$ atoms per square centimeter.

5. A method according to claim 3 wherein said ion implantation for said heavily doped areas has a dosage ranged from about $5 \times 10^{14}$ to $5 \times 10^{15}$ atoms per square centimeter.

6. A method according to claim 3 wherein said ion implantation for said enhanced lightly doped areas has a dosage ranged from about $1 \times 10^{13}$ to $5 \times 10^{15}$ atoms per square centimeter.

7. A method according to claim 1 wherein said first non-conductive layer is a silicon nitride layer.

8. A method according to claim 7 wherein said silicon nitride layer has a thickness of about 10 to 300 nanometers.

9. A method according to claim 1 wherein said second non-conductive layer is a silicon dioxide layer.

10. A method according to claim 9 wherein said silicon dioxide layer has a thickness of about 10 to 100 nanometers.

11. A method for manufacturing a metal-oxide-semiconductor (MOS) device having a drain and a source each of which has a lightly doped area and a heavily doped area, wherein each of said heavily doped areas of said drain and said source has an extension area extending from said each heavily doped area, said method comprising steps of:
    (a) preparing a silicon substrate;
    (b) forming a gate oxide layer over said silicon substrate, and forming a gate over said gate oxide layer;
    (c) lightly doping said silicon substrate to form said lightly doped areas of said source and said drain;
    (d) forming a first non-conductive layer covering said silicon substrate and said gate;
    (e) forming a second non-conductive layer covering said first nonconductive layer;
    (f) executing an ananisotropic etching on said second non-conductive layer to form a side-wall-spacer of said first non-conductive layer;
    (g) executing an ananisotropic etching on said first non-conductive layer to form an inner spacer formed by a portion of said first non-conductive layer having a stepped shape, wherein a stepped portion of said inner spacer is located under said side-wall-spacer of said first non-conductive layer;
    (h) removing said side-wall-spacer of said first non-conductive layer and keeping said inner spacer on said silicon substrate; and
    (i) heavily doping said silicon substrate to form said heavily doped areas and said extension areas of said source and said drain respectively, wherein said extension areas are located under said stepped portion of said inner spacer.

12. A method according to claim 11 wherein said gate is made of polysilicon.

13. A method according to claim 11 wherein said lightly doped area and said heavily doped area are formed by ion implantations respectively.

14. A method according to claim 13 wherein said ion implantation for said lightly doped area has a dosage ranged from about $10^{12}$ to $5 \times 10^{13}$ atoms per square centimeter.

15. A method according to claim 13 wherein said ion implantation for said heavily doped area has a dosage ranged from about $5 \times 10^{13}$ to $5 \times 10^{15}$ atoms per square centimeter.

16. A method according to claim 11 wherein said first non-conductive layer is a silicon nitride layer.

17. A method according to claim 16 wherein said silicon nitride layer has a thickness of about 10 to 300 nanometers.

18. A method according to claim 11 wherein said second non-conductive layer is a silicon dioxide layer.

19. A method according to claim 18 wherein said silicon dioxide layer has a thickness of about 10 to 100 nanometers.

* * * * *

UNITED STATES PATENT AND TRADEMARK OFFICE
CERTIFICATE OF CORRECTION

PATENT NO. : 6,004,851
DATED : December 21, 1999
INVENTOR(S) : C.-H. Peng

Page 1 of 1

It is certified that error appears in the above-identified patent and that said Letters Patent is hereby corrected as shown below:

Title page,
[56] Refs. Cited (Other Publs.), Insert the following reference: -- Lisa T. Su, "Recent Progress in High Performance 0.08µ m CMOS", IEDMS, A3-7-P.139, 1996, Month Unknown --

Attorney, Agent, or Firm; After "O'Connor" delete ";"

[57] Abstract 1 of text, "metal-oxide-semico nductor" should read "metal-oxide-semiconductor"

Claim 1, column 5,
Line 42, "(g)" should read "(h)"
Line 45, "(h)" should read "(i)"
Line 47, "(i)" should read "(j)"

Signed and Sealed this

Eleventh Day of September, 2001

*Attest:*

Nicholas P. Godici

NICHOLAS P. GODICI
*Acting Director of the United States Patent and Trademark Office*

*Attesting Officer*